United States Patent
Chiba

(10) Patent No.: US 8,055,969 B2
(45) Date of Patent: Nov. 8, 2011

(54) MULTI-STROBE CIRCUIT

(75) Inventor: Noriaki Chiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 184 days.

(21) Appl. No.: 12/498,781

(22) Filed: Jul. 7, 2009

(65) Prior Publication Data

US 2010/0011267 A1    Jan. 14, 2010

(30) Foreign Application Priority Data

Jul. 8, 2008    (JP) .................................. 2008-178364

(51) Int. Cl.
*G06F 11/00*    (2006.01)

(52) U.S. Cl. ........ 714/744; 714/724; 714/731; 714/736; 714/742; 714/745; 714/25; 714/709; 714/718; 714/719; 714/723; 365/200; 365/201; 702/57; 702/69; 702/72; 702/79; 702/117; 702/125

(58) Field of Classification Search .................. None
See application file for complete search history.

(56) References Cited

U.S. PATENT DOCUMENTS

| | | | | |
|---|---|---|---|---|
| 6,996,032 | B2* | 2/2006 | Ganry | 368/118 |
| 7,406,646 | B2* | 7/2008 | Sato et al. | 714/744 |
| 7,461,316 | B2* | 12/2008 | Hasegawa et al. | 714/744 |
| 7,512,872 | B2* | 3/2009 | Awaji et al. | 714/814 |
| 2005/0025190 | A1* | 2/2005 | Frisch | 370/503 |
| 2005/0149801 | A1* | 7/2005 | Oshima | 714/731 |
| 2005/0219937 | A1* | 10/2005 | Sato | 365/233 |
| 2006/0041799 | A1* | 2/2006 | Sato | 714/718 |
| 2006/0195740 | A1* | 8/2006 | Huott et al. | 714/731 |
| 2007/0067686 | A1* | 3/2007 | Khondker et al. | 714/731 |

* cited by examiner

*Primary Examiner* — John Trimmings
(74) *Attorney, Agent, or Firm* — Martine Penilla Group, LLP

(57) ABSTRACT

A multi-strobe circuit that latches a signal to be tested, an evaluation target, at each edge timing of a multi-strobe signal having a plurality of edges. An oscillator oscillates at a predetermined frequency in synchronization with a reference strobe signal. A latch circuit latches the signal to be tested at an edge timing of an output signal of the oscillator. A gate circuit is provided between a clock terminal of the latch circuit and the oscillator, and makes the output signal of the oscillator pass therethrough for a predetermined period. A clock transfer circuit loads the output signal of the latch circuit at an edge timing of the output signal of the oscillator and performs retiming on the output signal of the latch circuit by using a reference clock.

12 Claims, 3 Drawing Sheets

MULTI-STROBE CIRCUIT

CLAIM OF PRIORITY TO RELATED APPLICATION

The present application is claiming priority of Japanese Patent Application No. 2008-178364, filed on Jul. 8, 2008, the content of which is incorporated herein by reference.

BACKGROUND OF THE INVENTION

1. Field of the Invention

The present invention relates to a multi-strobe circuit that generates a multi-phase strobe signal (multi-strobe signal) to evaluate levels of a signal, an evaluation target, at a plurality of edge timings of the multi-strobe signal.

2. Description of the Relate Art

A multi-strobe circuit is used in a test apparatus for testing semiconductor devices such as memories or DSPs (Digital Signal Processors). The multi-strobe circuit generates a multi-strobe signal (also referred to as a multi-phase strobe signal) having a plurality of edges in a single cycle period of a signal to be tested (for example, a binary digital signal), and determines levels of a signal outputted from a semiconductor device at each edge timing thereof. By using the multi-strobe circuit, a timing (change-point) at which a level of a signal outputted from a semiconductor device makes a transition, can be detected, allowing the circuit to be used in evaluating the semiconductor device.

FIG. 1 is a circuit diagram illustrating a structural example of a multi-strobe circuit 300. N pieces of first delay elements $D1_1$ to $D1_N$ (collectively referred to as a first delay element D1) are connected together in cascade. A signal S1 to be tested outputted from a DUT (Device UnderTest) is inputted to the first delay element $D1_1$ in a first stage, the signal S1 to be tested being provided with a predetermined delay Tpd when passing through each of the first delay element D1. That is, a signal $S1_i$ to be tested, which is delayed by i×Tpd in comparison with the signal S1 to be tested outputted from the DUT, is outputted from the first delay element $D1_i$ in the i-th stage.

Each of N pieces of second delay elements $D2_1$ to $D2_N$ (collectively referred to as a second delay element D2) is provided for each of N pieces of the first delay elements $D1_1$ to $D1_N$, and connected together in cascade. A reference strobe signal STRB is inputted to the second delay element $D2_1$ in the first stage. The strobe signal STRB is provided with a predetermined delay (Tpd+Δt) when passing through each of the second delay element D2. The i-th phase strobe signal $STRB_i$ which is delayed by i×(Tpd+Δt) in comparison with the reference strobe signal STRB, is outputted from the second delay element D2 in the i-th stage.

Each of N pieces of latch circuits $L_1$ to $L_N$ (also referred to as timing comparators) is also provided for each of N pieces of the first delay elements $D1_1$ to $D1_N$. The i-th (where i is a natural number satisfying $1 \leq i \leq N$) latch circuit $L_i$ latches an output signal of the i-th first delay element $D1_i$ at an edge timing of the i-th phase strobe signal STRBi. It is needless to say that the latch circuit L1 illustrated by a D flip-flop in FIG. 1 can be replaced by various elements such as another flip-flop or latch circuit. Output signals $SL_1$ to $SL_N$ of N pieces of the latch circuits L are inputted to a logic unit 310, which executes predetermined signal processing in accordance with evaluation items of the DUT. When the signal S1 to be tested makes a transition from 0 to 1 (or from 1 to 0) at an point, the output signals $SL_1$ to $SL_N$ become thermometer codes in which 0 and 1 are varied with each other at a certain bit. Accordingly, the logic unit 310 includes a priority encoder.

A phase difference (timing) between the signal S1 to be tested to be inputted to the first delay element D1 and the strobe signal STRB to be inputted to the second delay element D2, is adjusted by a third delay element D3 provided in the preceding stage of N pieces of the second delay elements D2.

A relative time difference between the signal S1 to be tested and the strobe signal STRB is varied by Δt when passing through each of the first delay element D1 and the second delay element D2. That is, a value of the signal S1 to be tested can be determined at a timing of each of N pieces of the strobe signals (multi-strobe signals) $STRB_1$ to $STRB_N$, the phase between which is shifted by Δt from each other. Outline of the structure of the multi-strobe circuit 300 and performance thereof have been described above.

Because the multi-strobe circuit 300 includes a plurality of delay elements D1 and D2 and a plurality of latch circuits L, there is a problem that the circuit is large in size. In addition, if delay amounts of the first delay element D1 and the second delay element D2 are varied, timing accuracy between the signal S1 to be tested and the multi-strobe signals $STRB_1$ to $STRB_N$ is deteriorated. In particular, as a resolution capacity Δt is smaller, variations in the delay amounts of the first delay element D1 and the second delay element D2 influence the above timing accuracy more significantly, resulting in a large skew.

SUMMARY OF THE INVENTION

The present invention has been made in view of these problems, and an illustrative purpose of an embodiment of the invention is to provide a multi-strobe circuit in which a circuit area thereof can be reduced or calibration can be readily executed.

An embodiment of the present invention relates to a multi-strobe circuit that latches a signal to be tested, an evaluation target, at each edge timing of a multi-strobe signal having a plurality of edges. The multi-strobe circuit comprises an oscillator that oscillates at a predetermined frequency in synchronization with a reference strobe signal, and a latch circuit that latches the signal to be tested at an edge timing of an output signal of the oscillator.

According to the embodiment, because a multi-strobe signal having a cycle corresponding to the frequency of the oscillator is generated and the signal to be tested (data signal) is latched by a single latch circuit (timing comparator), the circuit can be smaller in size than conventional one. Further, because there is a single latch circuit used, there is an advantage that a skew between latch circuits, i.e., between phases, does not occur in principle, which has been a problem in a conventional circuit.

The multi-strobe circuit according to an embodiment may further comprise a gate circuit that is provided between a clock terminal of the latch circuit and the oscillator, and that makes the output signal of the oscillator pass therethrough for a predetermined period. According to the structure, the number of the phases of the multi-strobe signal can be set in accordance with the predetermined period.

The gate circuit may include a counter that counts the edge of the output signal of the oscillator such that the output signal thereof is made to pass through when a counter value is within a predetermined range. In this case, the number of the phases of the multi-strobe signal can be controlled in accordance with the count value. The aforementioned predetermined range may be optionally set. In this case, the number of the phases of the multi-strobe signal can be controlled.

The multi-strobe circuit may further comprise a clock transfer circuit that loads the output signal of the latch circuit at the edge timing of the output signal of the oscillator and performs retiming on the output signal of the latch circuit by using a reference clock. The clock transfer circuit may be replaced by an interleave circuit or an FIFO (First In First Out) circuit.

The multi-strobe circuit according to an embodiment may further comprise: a first variable delay circuit that is provided on a data terminal side of the latch circuit and delays the signal to be tested; and a second variable delay circuit that is provided on the clock terminal side of the latch circuit and delays the output signal of the oscillator. According to the embodiment, a skew between the data signal and the multi-strobe signal can be adjusted.

The oscillator may include a ring oscillator. Preferably, an oscillating frequency (cycle) of the ring oscillator can be adjusted.

The oscillator may include a PLL (Phase Locked Loop) circuit.

Another embodiment of the present invention relates to a test apparatus. The apparatus comprises: a comparator that compares a signal outputted from a DUT with a threshold voltage; a timing generator that generate a strobe signal, the level of which makes a transition at an arbitrary timing; and the multi-strobe circuit according to any one of the aforementioned embodiments, which receives an output signal of the comparator as the signal to be tested, and the strobe signal.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Herein, "the state where a member A is connected to a member B" includes not only the state where the member A is physically and directly connected to the member B but also the state where the member A is indirectly connected to the member B via another member that does not affect electrically the connection state between them. Likewise, "the state where a member C is provided between a member A and a member B" includes not only the state where the member A and the member C, or the member B and the member C, are connected directly, but also the state where they are connected indirectly via another member that does not affect electrically the connection state between them.

Figure 2:
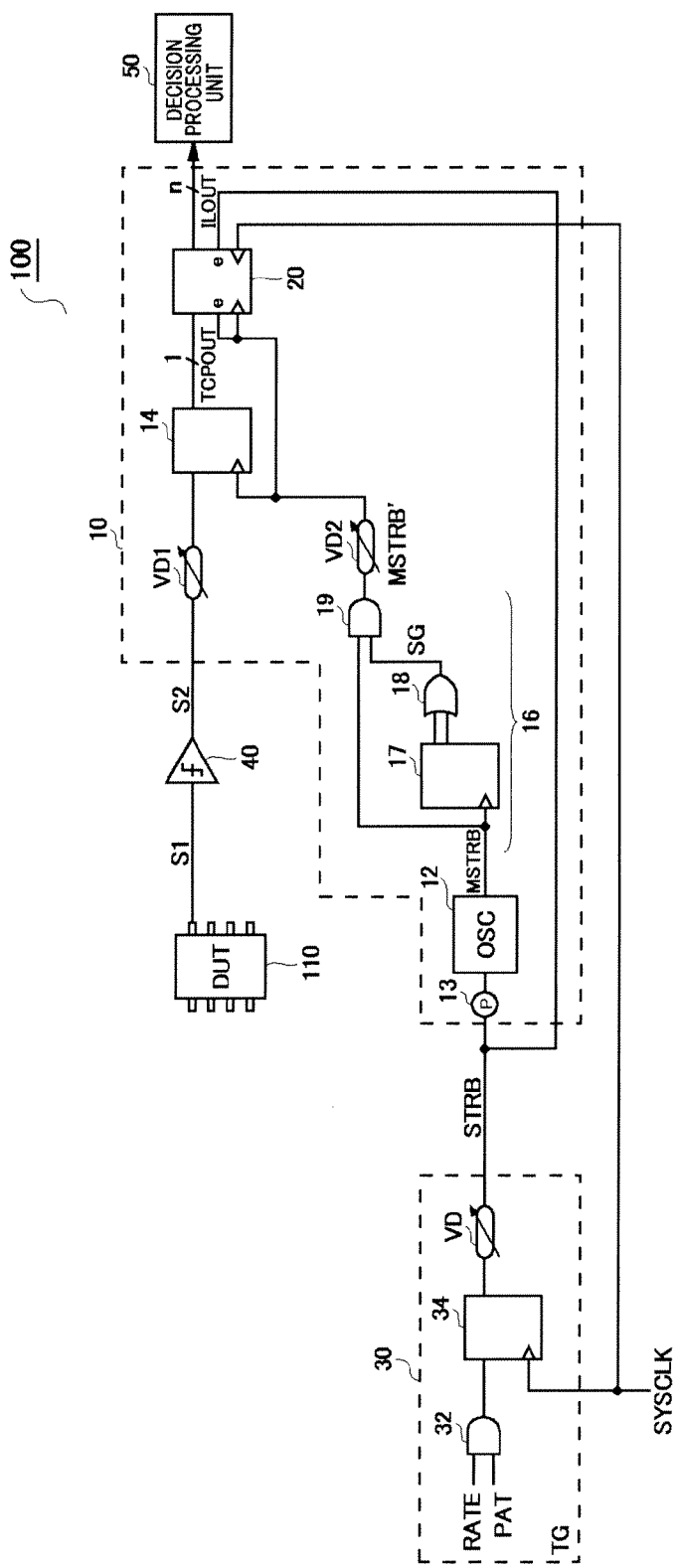
FIG. 2 is a block diagram illustrating a structure of a test apparatus provided with a multi-strobe circuit according to an embodiment.

FIG. 2 is a block diagram illustrating a structure of a test apparatus 100 provided with a multi-strobe circuit 10 according to an embodiment. The test apparatus 100 receives a signal S1 to be tested outputted from a DUT 110 such as a memory, DSP or another digital circuit, etc., and executes a predetermined test.

The test apparatus 100 comprises a timing generator 30, a level comparator 40 and a decision processing unit 50 in addition to the multi-strobe circuit 10. The level comparator 40 includes at least one comparator to compare an electric potential of the signal S1 to be tested outputted from the DUT 110 with a low-level threshold voltage VOL (or a high-level threshold voltage VOH), and generates the signal S1 to be tested, the high-level and the low-level of which is varied in accordance with a comparison result. The level comparator 40 may be most readily structured by a comparator that compares the electric potential of the signal S1 to be tested with a single threshold voltage common between the high-level and the low-level, or by a simple inverter (buffer).

The timing generator 30 generates a strobe signal STRB, the level of which makes a transition at an arbitrary timing in accordance with a sequence specified by a test program (i.e., the signal STRB has an edge). The timing generator 30 includes an AND gate 32, a latch circuit 34 and a variable delay circuit VD. The AND gate 32 generates a logical multiplication of a rate signal RATE and a pattern signal PAT. The latch circuit 34 synchronizes an output signal of the AND gate 32 with a system clock SYSCLK. The variable delay circuit VD provides a variable delay to an output signal of the latch circuit 34. An output signal of the variable delay circuit VD3 is outputted as the strobe signal STRB. The timing generator 30 may have any other structure, without being limited to that in FIG. 2.

The multi-strobe circuit 10 receives the signal S2 to be tested and the strobe signal STRB. The multi-strobe circuit 10 latches the signal S2 to be tested by each edge timing of a multi-strobe signal MSTRB having a plurality of edges to evaluate a value of the signal S2 to be tested at each timing thereof. In the embodiment, it is assumed that values of the signal S2 to be tested are evaluated at n phases of timings for one cycle of the signal S2 to be tested.

The multi-strobe circuit 10 includes an oscillator 12, a pulsar 13, a latch circuit 14, a gate circuit 16, a clock transfer circuit 20, a first variable delay circuit VD1 and a second variable delay circuit VD2.

The oscillator 12 oscillates at a predetermined frequency f1 in synchronization with the reference strobe signal STRB. The frequency f1 of the oscillator 12 is set in accordance with an edge interval of the multi-strobe signal MSTRB, which specifies the timing at which the signal S1 to be tested is latched. The frequency f1 is usually set to a value obtained by multiplying or dividing data rate of the signal S1 to be tested (hereinafter, described by m-times) by an integer; however, any real number may be adopted. An output of the oscillator 12 is outputted as the multi-strobe signal MSTRB.

The oscillator 12 is, for example, a ring oscillator that oscillators at a predetermined frequency. The oscillating frequency f1 is adjusted by controlling a delay amount of a buffer (inverter) that structures the ring oscillator. The oscillator 12 may be structured by a PLL (Phase Locked Loop) circuit instead of the ring oscillator.

The pulsar 13 is provided in the preceding stage of the oscillator 12. The pulsar 13 cuts out a periphery of the edge of the strobe signal STRB to shorten a pulse width thereof. The strobe signal STRB outputted from the pulsar 13 is injected into the oscillator 12. As a result, the strobe signal STRB and the multi-strobe signal MSTRB are synchronized with each other.

The latch circuit 14 latches a signal S2 to be tested, the level of which is determined by the level comparator 40, at the edge timing of the multi-strobe signal MSTRB outputted from the oscillator 12. The latch circuit 14 is also called a timing comparator TCP. The first variable delay circuit VD1 is provided between a data terminal of the latch circuit 14 and the level comparator 40, while the second variable delay circuit VD2 is provided between a clock terminal of the latch circuit 14 and the oscillator 12. A skew between the signal S1 to be tested and the multi-strobe signal MSTRB can be adjusted by independently adjusting delay amounts of the first variable delay circuit VD1 and the second variable delay circuit VD2. It is noted that either one of the first variable delay circuit VD1 and the second variable delay circuit VD2 may be a fixed delay circuit, because a relative phase between the signal S2 to be tested and the multi-strobe signal MSTRB only has to be adjusted.

The gate circuit 16 is provided between the clock terminal of the latch circuit 14 and the oscillator 12, i.e., provided on the path of the multi-strobe signal MSTRB. The gate circuit 16 makes the multi-strobe signal MSTRB pass through for a predetermined period, and shields the signal MSTRB for a period excluding that.

The gate circuit 16 includes a counter 17, a logic circuit 18 and an AND gate 19. The counter 17 counts the edge of the multi-strobe signal MSTRB. When a count value CNT is within a predetermined range, the gate circuit 16 makes the multi-strobe signal MSTRB pass therethrough. The logic circuit 18 generates a gate signal SG that is in a high-level (is asserted) when the count value is within the predetermined range. The AND gate 19 outputs a logical multiplication MSTRB' of the gate signal SG and the multi-strobe signal MSTRB. The predetermined range may be the case where the count value CNT is more than or equal to 0 and less than or equal to n (where n is a natural number).

The clock transfer circuit 20 loads an output signal TCPOUT of the latch circuit 14 at an edge timing of the multi-strobe signal MSTRB' and converts it into an n-bit parallel signal ILOUT equal to the frequency of the strobe signal STRB. Thereafter, the clock transfer circuit 20 performs retiming on the parallel signal ILOUT by using the system clock SYSCLK and outputs it. The clock transfer circuit 20 may be replaced by an interleave circuit or an FIFO.

The decision processing unit 50 receives the output signal ILOUT of the clock transfer circuit 20, and determines whether the DUT 110 is good or specifies where a defect occurs, by comparing the output signal ILOUT with, for example, an expected value. Processing of the decision processing unit 50 is not particularly limited.

Figure 3:
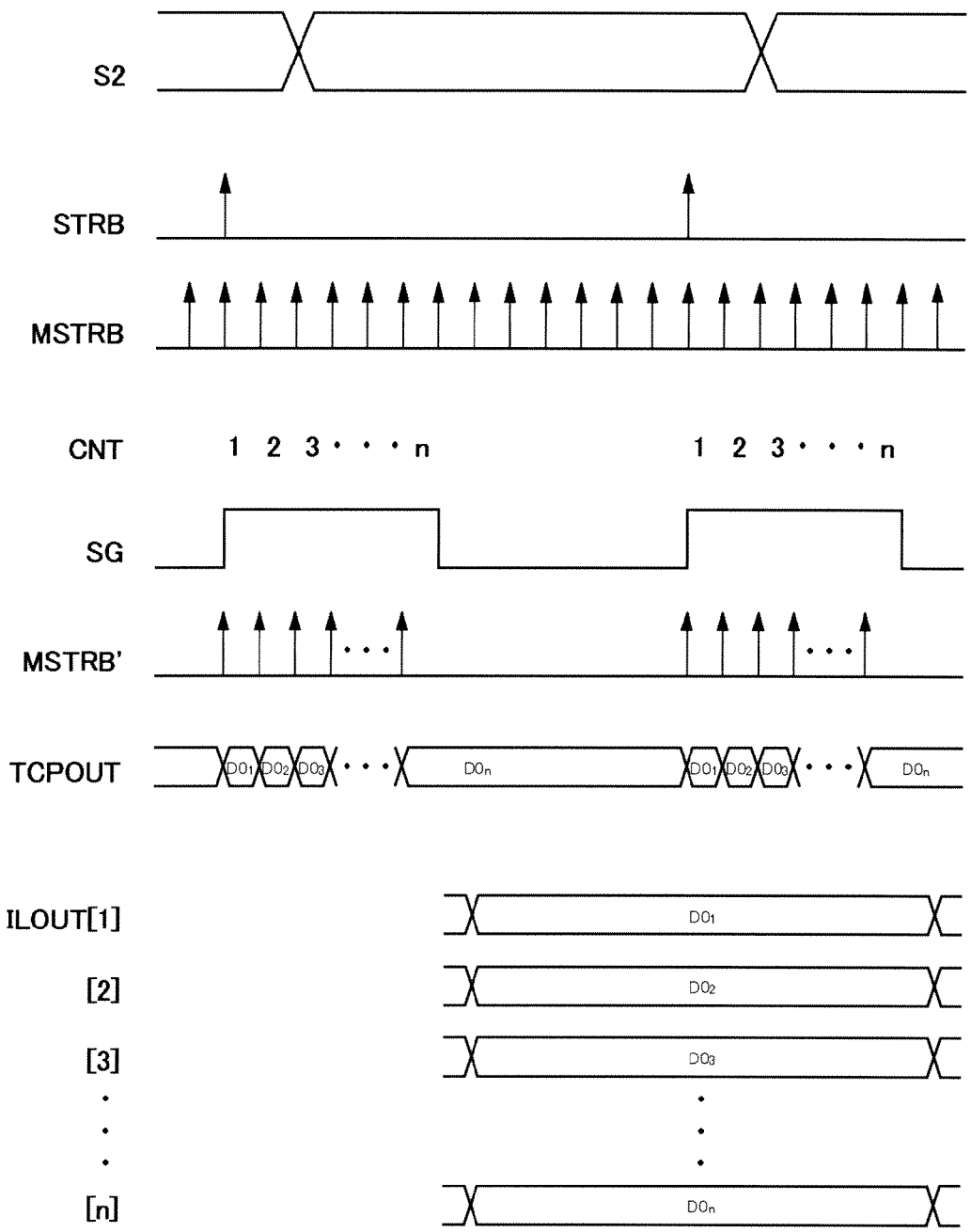
FIG. 3 is a time chart illustrating performance of the multi-strobe circuit in FIG. 2.

The structure of the test apparatus 100 has been described above. Subsequently, performance thereof will be described. FIG. 3 is a time chart illustrating performance of the multi-strobe circuit 10 in FIG. 2. The strobe signal STRB having an edge at an arbitrary timing for every cycle (test cycle) of the signal S1 to be tested, is generated by the timing generator 30. When the strobe signal STRB is injected, the oscillator 12 generates the multi-strobe signal MSTRB that is synchronized therewith and has an m-times frequency in comparison therewith. The gate circuit 16 counts the multi-strobe signal MSTRB to assert the gate signal SG when the count value CNT is within the predetermined range, specifically, when the count value is less than or equal to n. While the gate signal SG is being asserted, the multi-strobe signal MSTRB' is cut out and supplied to the clock terminal of the latch circuit 14.

The latch circuit 14 latches the signal S2 to be tested at each edge timing of the multi-strobe signal MSTRB'. The output data TCPOUT is outputted from the latch circuit 14. The output data TCPOUT includes n pieces of data $DO_1$ to $Do_n$, in a serial format, which are latched at m-times data rate in comparison with the frequency of the strobe signal STRB.

The clock transfer circuit 20 performs retiming on the output data TCPOUT to convert it into n-bit output data ILOUT in a parallel format. That is, the output data ILOUT includes n pieces of the data $DO_1$ to $DO_n$. The decision processing unit 50 executes various signal processing by using the output data ILOUT thus generated, and evaluates the DUT 110.

Performance of the multi-strobe circuit 10 has been described above. The multi-strobe circuit 10 has the following advantages.

Figure 1:
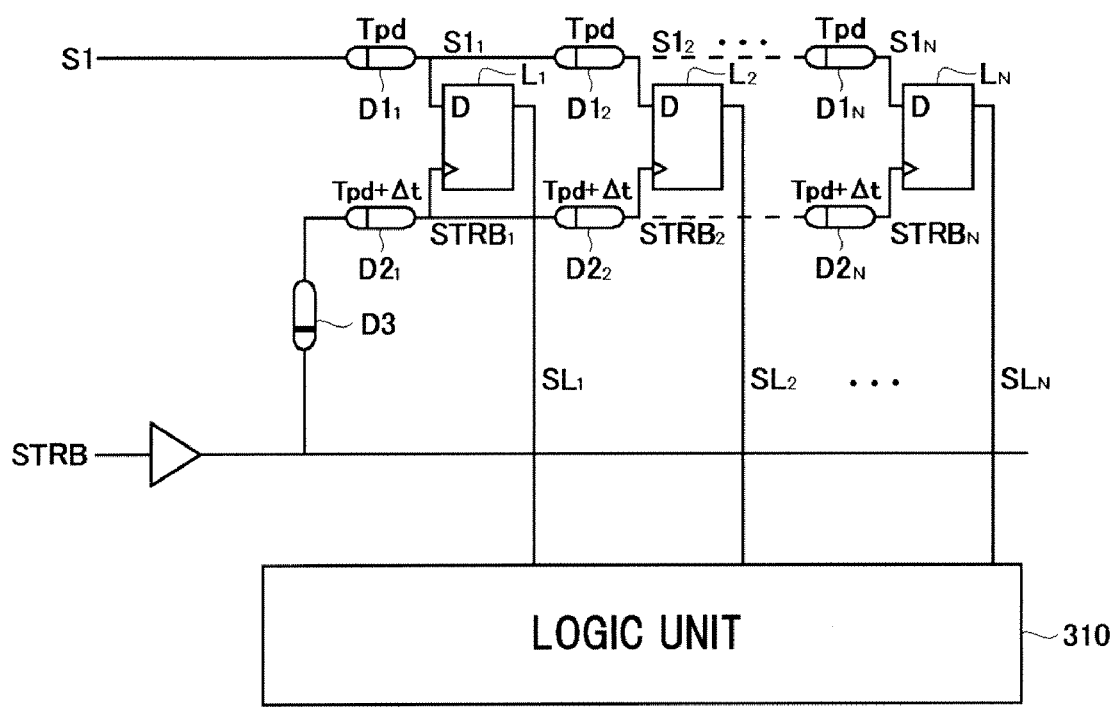
FIG. 1 is a circuit diagram illustrating a structural example of a multi-strobe circuit.

In the multi-strobe circuit 10 in FIG. 2, the number of the timing comparators (latch circuits) and the number of the delay elements can be reduced in comparison with those in the conventional multi-strobe circuit 300 in FIG. 1, allowing the circuit to be small in size.

Further, in the multi-strobe circuit 10 in FIG. 2, the calibration for optimizing a delay amount of each delay element can be simplified in comparison with that in a conventional circuit. Specifically, in the conventional multi-strobe circuit 300, it is needed that delay amounts of the delay elements D1 and D2 are optimized at each phase timing comparator (latch circuit L) such that each phase time interval and a skew are adjusted. Accordingly, the number of the delay elements to be adjusted becomes n×2 relative to n phases of the timing comparators. On the other hand, in the multi-strobe circuit 10 in FIG. 2, each phase time interval can be obtained only by adjusting the oscillating frequency of the oscillator 12, allowing the calibration to be realized by controlling substantially a single place. When the oscillator 12 is a ring oscillator, a loop delay period of the oscillator 12 only has to be adjusted, and when that is a PLL circuit, an integer multiplication (and/or a division number) only has to be adjusted.

Further, in the conventional multi-strobe circuit 300 in FIG. 1, data cannot be loaded by using a multi-strobe signal having phases exceeding the initially designed number of timing comparators. On the other hand, according to the multi-strobe circuit 10 in FIG. 2, the number of the phases can be flexibly set by adjusting the frequency of the oscillator 12 (i.e., each phase time interval of the multi-strobe signal MSTRB) and the pulse width of the gate signal SG of the gate circuit 16. Because the gate circuit 16 in FIG. 2 uses the counter 17, an upper limit (lower limit) of the counter value only has to be set, allowing the number of the phases to be readily set.

Furthermore, adjustment of the timing between the signal S2 to be tested and the multi-strobe signal MSTRB' is realized by using the first variable delay circuit VD1 and the second variable delay circuit VD2, allowing the adjustment to be realized by adjusting two places. Accordingly, in the multi-strobe circuit 10 in FIG. 2, the calibration can be realized by adjusting at most three places, allowing the calibration to be executed in a short time.

Data for setting the delay amounts, which are optimized by the result of the calibration, are held in a register. Accordingly, in the multi-strobe circuit 10 in FIG. 2, a capacity of the register can be small, allowing a circuit area thereof to be reduced.

While the preferred embodiments of the present invention have been described using specific terms, such description is for illustrative purposes only, and it is to be understood that changes and variations may be made without departing from the spirit or scope of the appended claims.

What is claimed is:

1. A multi-strobe circuit that latches a signal to be tested, an evaluation target, at each edge timing of a multi-strobe signal having a plurality of edges, the multi-strobe circuit comprising:
   an oscillator that oscillates at a predetermined frequency in synchronization with a reference strobe signal;
   a latch circuit that latches the signal to be tested at an edge timing of an output signal of the oscillator; and
   a gate circuit that is provided between a clock terminal of the latch circuit and the oscillator, and that makes the output signal of the oscillator pass through the gate circuit for a predetermined period, wherein the gate circuit includes a counter that counts the edge of the output signal of the oscillator such that the output signal of the oscillator is made to pass through when a counter value is within a predetermined range.

2. The multi-strobe circuit according to claim 1 further comprising:
   a first variable delay circuit that is provided on a data terminal side of the latch circuit and delays the signal to be tested; and
   a second variable delay circuit that is provided on a clock terminal side of the latch circuit and delays the output signal of the oscillator.

3. A multi-strobe circuit that latches a signal to be tested, an evaluation target, at each edge timing of a multi-strobe signal having a plurality of edges, the multi-strobe circuit comprising:
   an oscillator that oscillates at a predetermined frequency in synchronization with a reference strobe signal;
   a latch circuit that latches the signal to be tested at an edge timing of an output signal of the oscillator; and
   a clock transfer circuit that loads the output signal of the latch circuit at the edge timing of the output signal of the oscillator and performs retiming on the output signal of the latch circuit by using a reference clock.

4. The multi-strobe circuit according to claim 3 further comprising:
   a first variable delay circuit that is provided on a data terminal side of the latch circuit and delays the signal to be tested; and
   a second variable delay circuit that is provided on a clock terminal side of the latch circuit and delays the output signal of the oscillator.

5. A multi-strobe circuit that latches a signal to be tested, an evaluation target, at each edge timing of a multi-strobe signal having a plurality of edges, the multi-strobe circuit comprising:
   an oscillator that oscillates at a predetermined frequency in synchronization with a reference strobe signal; and
   a latch circuit that latches the signal to be tested at an edge timing of an output signal of the oscillator, wherein the oscillator includes a ring oscillator.

6. The multi-strobe circuit according to claim 5 further comprising:
   a first variable delay circuit that is provided on a data terminal side of the latch circuit and delays the signal to be tested; and
   a second variable delay circuit that is provided on a clock terminal side of the latch circuit and delays the output signal of the oscillator.

7. A multi-strobe circuit that latches a signal to be tested, an evaluation target, at each edge timing of a multi-strobe signal having a plurality of edges, the multi-strobe circuit comprising:
   an oscillator that oscillates at a predetermined frequency in synchronization with a reference strobe signal; and
   a latch circuit that latches the signal to be tested at an edge timing of an output signal of the oscillator, wherein the oscillator includes a PLL (Phase Locked Loop) circuit.

8. The multi-strobe circuit according to claim 7 further comprising:
   a first variable delay circuit that is provided on a data terminal side of the latch circuit and delays the signal to be tested; and
   a second variable delay circuit that is provided on a clock terminal side of the latch circuit and delays the output signal of the oscillator.

9. A test apparatus comprising:
   a comparator that compares a signal outputted from a device under test with a threshold voltage;
   a timing generator that generates a strobe signal, the level of which makes a transition at an arbitrary timing; and
   the multi-strobe circuit according to claim 1 that receives an output signal of the comparator as the signal to be tested, and the strobe signal.

10. A test apparatus comprising:
    a comparator that compares a signal outputted from a device under test with a threshold voltage;
    a timing generator that generates a strobe signal, the level of which makes a transition at an arbitrary timing; and
    the multi-strobe circuit according to claim 3 that receives an output signal of the comparator as the signal to be tested, and the strobe signal.

11. A test apparatus comprising:
    a comparator that compares a signal outputted from a device under test with a threshold voltage;
    a timing generator that generates a strobe signal, the level of which makes a transition at an arbitrary timing; and
    the multi-strobe circuit according to claim 5 that receives an output signal of the comparator as the signal to be tested, and the strobe signal.

12. A test apparatus comprising:
    a comparator that compares a signal outputted from a device under test with a threshold voltage;
    a timing generator that generates a strobe signal, the level of which makes a transition at an arbitrary timing; and
    the multi-strobe circuit according to claim 7 that receives an output signal of the comparator as the signal to be tested, and the strobe signal.

* * * * *